United States Patent
Case et al.

(10) Patent No.: US 6,999,011 B2
(45) Date of Patent: Feb. 14, 2006

(54) MICROCODE DRIVEN ADJUSTMENT OF ANALOG-TO-DIGITAL CONVERTER

(75) Inventors: Daniel Case, Gilroy, CA (US); Gerald L. Dybsetter, Scotts Valley, CA (US); Jayne C. Hahin, Cupertino, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/814,440

(22) Filed: Mar. 31, 2004

(65) Prior Publication Data
US 2005/0128114 A1 Jun. 16, 2005

Related U.S. Application Data

(60) Provisional application No. 60/530,038, filed on Dec. 15, 2003.

(51) Int. Cl.
*H03M 1/06* (2006.01)
(52) U.S. Cl. .................. 341/118; 341/155; 341/161
(58) Field of Classification Search ............... 341/138, 341/139, 155, 158, 161, 110, 118
See application file for complete search history.

(56) References Cited

U.S. PATENT DOCUMENTS

| | | | |
|---|---|---|---|
| 6,252,528 B1 * | 6/2001 | Perez et al. | 341/110 |
| 6,512,472 B1 * | 1/2003 | Smith et al. | 341/155 |
| 6,515,602 B1 * | 2/2003 | Ahn et al. | 341/139 |
| 6,567,025 B1 * | 5/2003 | Schreier et al. | 341/139 |
| 6,587,291 B1 * | 7/2003 | Patapoutian et al. | 341/70 |

* cited by examiner

*Primary Examiner*—Lam T. Mai
(74) *Attorney, Agent, or Firm*—Workman Nydegger

(57) ABSTRACT

Microcode driven adjustment of analog scaling of an analog signal prior to being provided to an analog-to-digital converter. The microcode also causes the system to read the resulting digital value, and determine whether the scaling value should be adjusted for that analog signal. Accordingly, the microcode may cause the analog signal to be dynamically adjusted to be within the input range of the analog-to-digital converter, thereby allowing for more accurate digital conversions with lower resolution analog-to-digital converters. The microcode rapidly adjusts for any fluctuations in the input voltage. Accordingly, the analog signal may fluctuate, or even be multiplexed from a wide variety of different analog signal sources.

39 Claims, 3 Drawing Sheets

MICROCODE DRIVEN ADJUSTMENT OF ANALOG-TO-DIGITAL CONVERTER

CROSS-REFERENCE TO RELATED APPLICATIONS

This application claims the benefit of U.S. Provisional Application No. 60/530,038 filed Dec. 15, 2003, which is incorporated herein by reference in its entirety.

BACKGROUND OF THE INVENTION

1. Field of the Invention

The present invention relates generally to analog-to-digital converters. In particular, the present invention relates to the use of microcode to dynamically adjust the analog-to-digital converter.

2. Background and Relevant Art

Electronic and computing technology has transformed the way that we work and play. The complexity of such systems facilitates the accomplishment of complex tasks that would not be possible (or at least would be very difficult) without the assistance of the system.

A core function behind such systems is the ability to process and interpret electrical signals. Some electrical signals may be continuously variable and able to represent any value in a continuous spectrum. These signals are often referred to as "analog" signals. For example, many sensors initial convert measured physical phenomenon (such as, for example, supply voltages, receive and transmit strength, temperature, and the like) into an analog signal.

Another kind of electrical signal is one that is not continuously variable, but only takes discrete values. Digital signals have the disadvantage of only being able to represent discrete values. If a value between neighboring discrete values is to be represented, some error is introduced by having to represent that value with a neighboring discrete value in digital form. Nevertheless, the use of digital signals also has many advantages over analog signals. For example, digital values can be directly processed by a microprocessor or other digital systems.

Since the use of analog signals and the use of digital signals both have there advantages depending on the particular function being performed, many circuits include both analog components which process analog signals, and digital components which process digital signals. In order to allow these analog and digital components to interact, often digital signals are converted to analog signals using Digital-to-Analog Converters (i.e., "DACs"). Likewise, analog signals are often converted to digital signals using Analog-to-Digital Converters (i.e., "ADCs").

Analog-to-digital converters convert an analog signal into a digital signal having a certain number of bits of resolution. The more bits the analog signal is converted into, the more accurate on average is the digital representation of that analog signal. For example, an 8-bit analog-to-digital converter converts an analog signal into an 8-bit digital value. A 12-bit analog-to-digital converter converts an analog signal into a more precise 12-bit digital value.

Analog-to-digital converters tend to be quite large as they use many devices in order to perform the conversion, particularly if high speed conversion is desired. Furthermore, the higher the resolution of the conversion (i.e., the higher the number of bits that the analog signal is converted into), the more components are required.

Analog-to-digital converters do have certain limits in that they can only convert an analog signal within a certain voltage range to a digital signal. Generally speaking, the closer the analog signal is to the boundaries of this range, the less accurate the digital representation. Analog signals outside of the range have significant error. Accordingly, the analog-to-digital converter is designed so that the analog signals average around the middle of the input range of the analog-to-digital converter, while hopefully never exceeding the boundaries of the range. Analog signals are statically amplified to hopefully meet these parameters.

However, there may be considerable uncertainty in the voltage level of the analog signal. For example, in a given system there may be many sensors that monitor a wire variety of physical phenomena such as power levels, receive and transmit strength, and temperature. In order to be interpreted by a microprocessor, these various analog signals would need to be converted into a digital signal. To reduce the number of analog-to-digital converters, these various analog signals may be time-division-multiplexed so that each has its own turn being provided to the analog-to-digital converter. For example, the temperature analog signal may be provided to the analog-to-digital converter during one time slot, the power supply level analog signal may be provided to the analog-to-digital converted during another time slot, and so forth. So that each analog signal is within the range of the analog-to-digital circuit, each analog signal may be scaled.

Such scaling is typically fairly static having a relatively constant and non-adjustable gain. Accordingly, if the analog signal provided by the sensor runs to one extreme or the other, the scaled signal will also tend to press the boundaries of (or even exceed) the range of the analog-to-digital converter. To guard against this, many analog-to-digital circuits convert to a higher number of bits and are designed for a broader range. However, this increases the complexity and size of the analog-to-digital converter.

Accordingly, what would be advantageous are mechanism in which the scaling of the analog signal provided to the analog-to-digital signal may be dynamically adjusted, while still having the resulting digital signals properly interpreted by the system to account for dynamically changing gain.

BRIEF SUMMARY OF THE INVENTION

The foregoing problems with the prior state of the art are overcome by the principles of the present invention, which may be implemented in a system that includes an analog scaler that is configured to scale an analog signal with an adjustable scaling value, an analog-to-digital converter configured to convert the scaled analog signal to a digital signal, one or more processors, and a system memory having stored therein microcode that is accessible and executable by the one or more processors.

When executed by the one or more processors, the microcode causes the system to adjust the scaling of the analog signal to allow the analog-to-digital converter to convert the scaled analog signal into a digital signal representing a digital value. The microcode then causes the system to read the digital value, and process the digital value taking into consideration the adjusted gain.

Since the microcode is what changes the scaling, the microcode logic also may properly interpret the result, regardless of how the gain was adjusted. Accordingly, the microcode may be designed to cause the analog signal voltage level to be optimized to the input range of the analog-to-digital converter regardless of how variable the voltage level of the pre-amplified signal is. The analog-to-digital converter may be a low-bit (e.g., an 8-bit converter)

while still providing accurate converted digital values. Furthermore, since the scaled analog signal may fluctuate widely while still providing accurate conversion, the analog signal may be multiplexed from a wide variety of different analog signal sources. Accordingly, a single analog-to-digital converter may convert analog signals from a variety of sources thereby reducing the amount of area used by analog-to-digital converters as a whole. In one embodiment, the signal sources are sensors such as temperature sensors, receive and transmit power strength sensors, or voltage level sensors.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The principles of the present invention provide for microcode-driven adjustment of analog signal scaling prior to the analog signal being provided to an analog-to-digital converter. The microcode also causes the system to read and interpret the digital value using the adjusted scaling value. Accordingly, the microcode quickly adjusts the scaling value when it is determined that an adjustment should be made in light of the input range of the analog-to-digital converter, thereby resulting in accurate digital conversions. Since this adjustment is processor driven, the adjustment is rapid and thus highly fluctuating analog signals (or even different multiplexed analog signals) may be accurately converted and interpreted.

Figure 1:
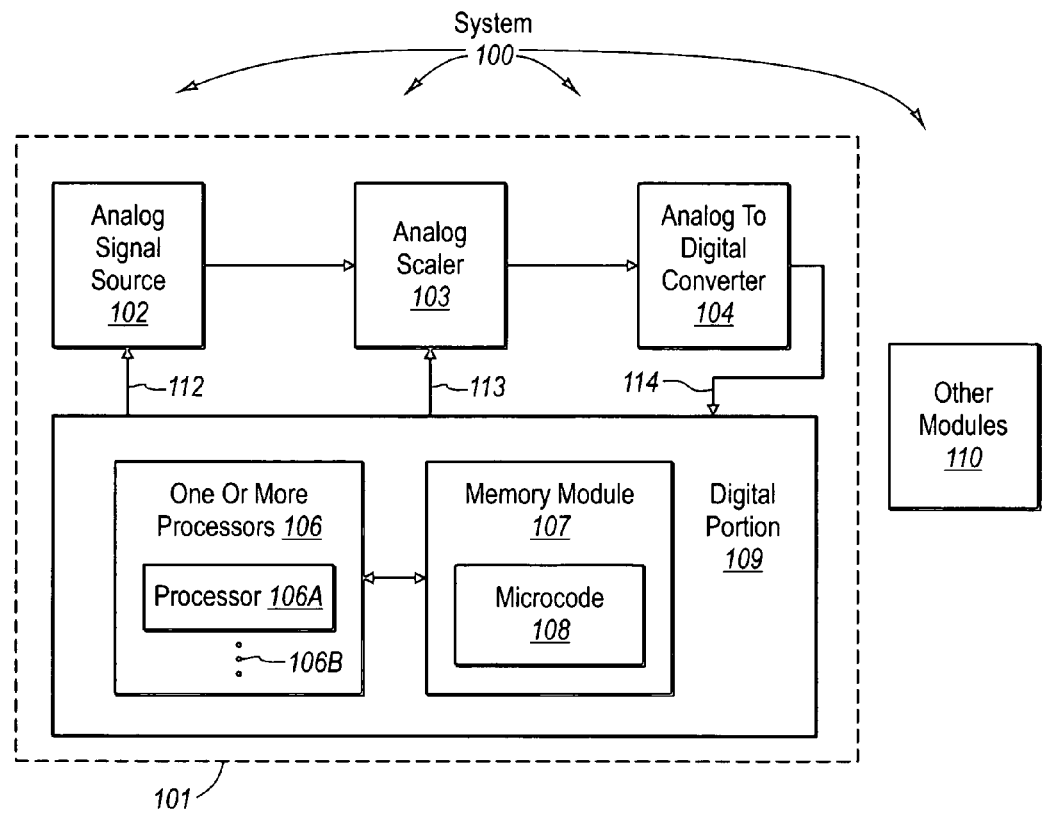
FIG. 1 illustrates an example of system that in which microcode may drive the adjustment of gain and current pre-scaling performed on an analog signal prior to conversion to a digital value in accordance with the present invention.

Turning to the drawings, FIG. 1 illustrates a suitable electronic or computing system 100 in which the principles of the present invention may be employed. The most basic system configuration is represented by the components within the dashed box 101.

The system includes an analog signal source 102, which may include component(s) that generate analog signals or perhaps just relay analog signals or a derivative of a received analog signal from a different component external to the analog signal source 102. Note that although an arrow 112 is shown leading from the digital portion 109 to the analog source 102, this does not represent that the digital portion 109 supplies the analog signal, only that the digital portion 109 may optionally control the analog signal source 102 in a manner described further below.

The analog signal is provided from the analog signal source 102 to an analog scaler 103, which scales the analog signal proportionate to its original amplitude. The scaled signal is then provided to an analog-to-digital converter 104 which samples the analog signal, and converts the voltage level of the signal at the sample time to a digital signal representing a digital value.

The system includes a digital portion 109 that includes one or more processors 106 and a memory module 107. The one or more processors 106 include at least processor 106A as well as potentially others as represented by the vertical ellipses 106B. At least one of the processors is capable of accessing the memory 107 to execute any microcode thereon.

The memory 107 has thereon microcode 108 that is readable and executable by the one or more processors 106. The memory 107 may be volatile (such a Random Access Memory (RAM)), or may be non-volatile (such as Read Only Memory (ROM), Flash memory, or the like), or a combination of volatile or non-volatile memory. However, the memory 107 may be any memory capable of containing microcode that may be directly or indirectly accessed by the one or more processors 106 for execution. Such processor-readable media may include, but is not limited to, RAM, ROM, EEPROM, flash memory, other memory technology, CD-ROM, digital versatile disks, other optical storage, magnetic cassettes, magnetic tape, magnetic disk storage, other magnetic storage devices, and any other media that can be used to store the desired information and that can be accessed by a processor.

Optionally, there may be other modules 110 within the system 100. Whether or not there are other modules 110, and the nature of the modules 110, will depend on the nature of the system 100. The system 100 may be any electronic or computing system including, but not limited to any general-purpose or special-purpose computing or communications environments or configurations. Examples of well known computing systems, environments, and configurations include, but are not limited to, laser transmitter/receivers, mobile telephones, pocket computers, personal computers, servers, multiprocessor systems, microprocessor-based systems, minicomputers, mainframe computers, and distributed computing environments that include any of the above systems or devices. Any of these example systems are suitable for use with the principles of the present invention.

Figure 4:
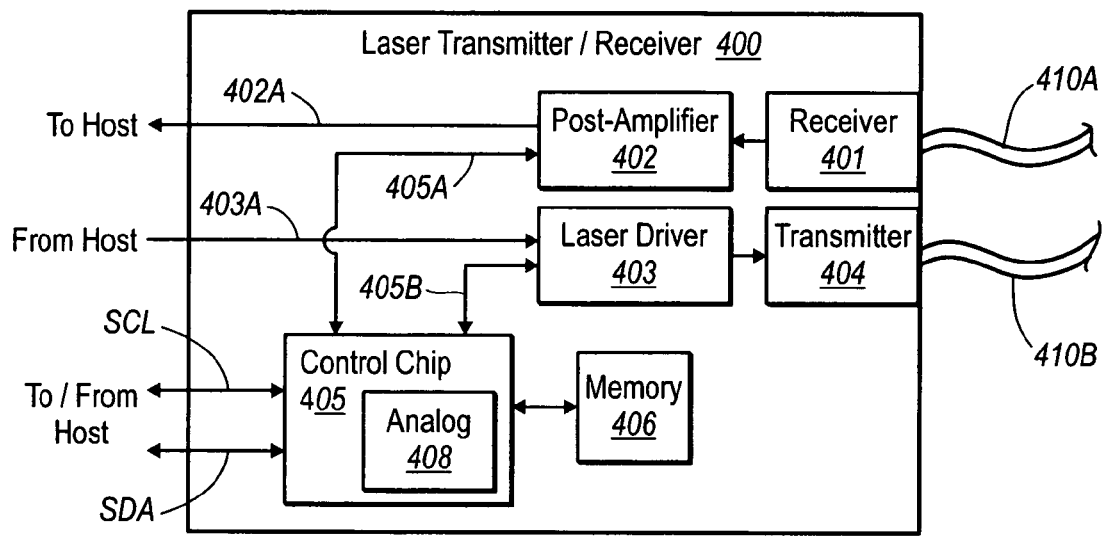
FIG. 4 illustrates a schematic diagram of a laser transmitter/receiver that represents one of many systems in which the principles of the present invention may be employed.

If the system 100 was a general-purpose computing system, the other modules 110 may include, for example, video adaptor modules, network interface modules, hard disk drive interfaces, optical disk drive interfaces, magnetic disk drive interfaces, or the like. If the system 100 was a laser transmitter/receiver, the other modules 110 may include laser drivers, analog-to-digital converters, digital-to-analog converters, serial interface controllers, or the like. FIG. 4 illustrates a specific embodiment of a laser transmitter/receiver 400, which will be described in further detail below with respect to FIGS. 4 and 5. However, those of ordinary skill in the art will recognize after having read this disclosure, that the principles of the present invention are not limited to application in a general-purpose computing system, or a laser transmitter/receiver, notwithstanding the detailed description of the laser transmitter/receiver which follows further below.

Figure 2:
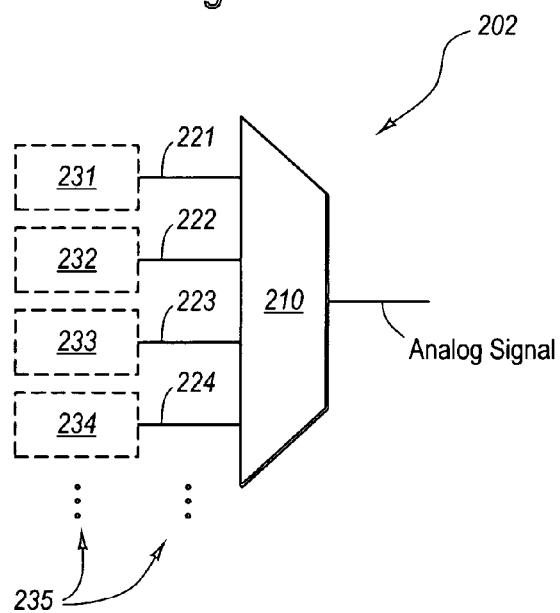
FIG. 2 illustrates one embodiment of the analog signal source of FIG. 1 in further detail.

FIG. 2 schematically illustrates an embodiment 202 of the analog signal source 102 in further detail. The analog signal source 202 includes a number of analog signal sources such as, for example, analog signal sources 231, 232, 233 and 234 among potentially many others as represented by the horizontal ellipse 235. Each of the analog signal sources 231 through 234 generates a corresponding analog signal 221 through 224, respectively, which are provided to a multiplexer 210. The multiplexer 210 selects one of the analog signals 221 through 224 (e.g., using time division multiplexing or using selection signals) and provides the selected analog signal on its output terminal, for ultimate presentation to the analog-to-digital converter 104. In one embodiment, the analog signal sources 231, 232, 233 and 234 are sensors that sense such physical phenomena as temperature, receive and transmit power strength, or supply voltage, although this need not be the case.

Figure 3:
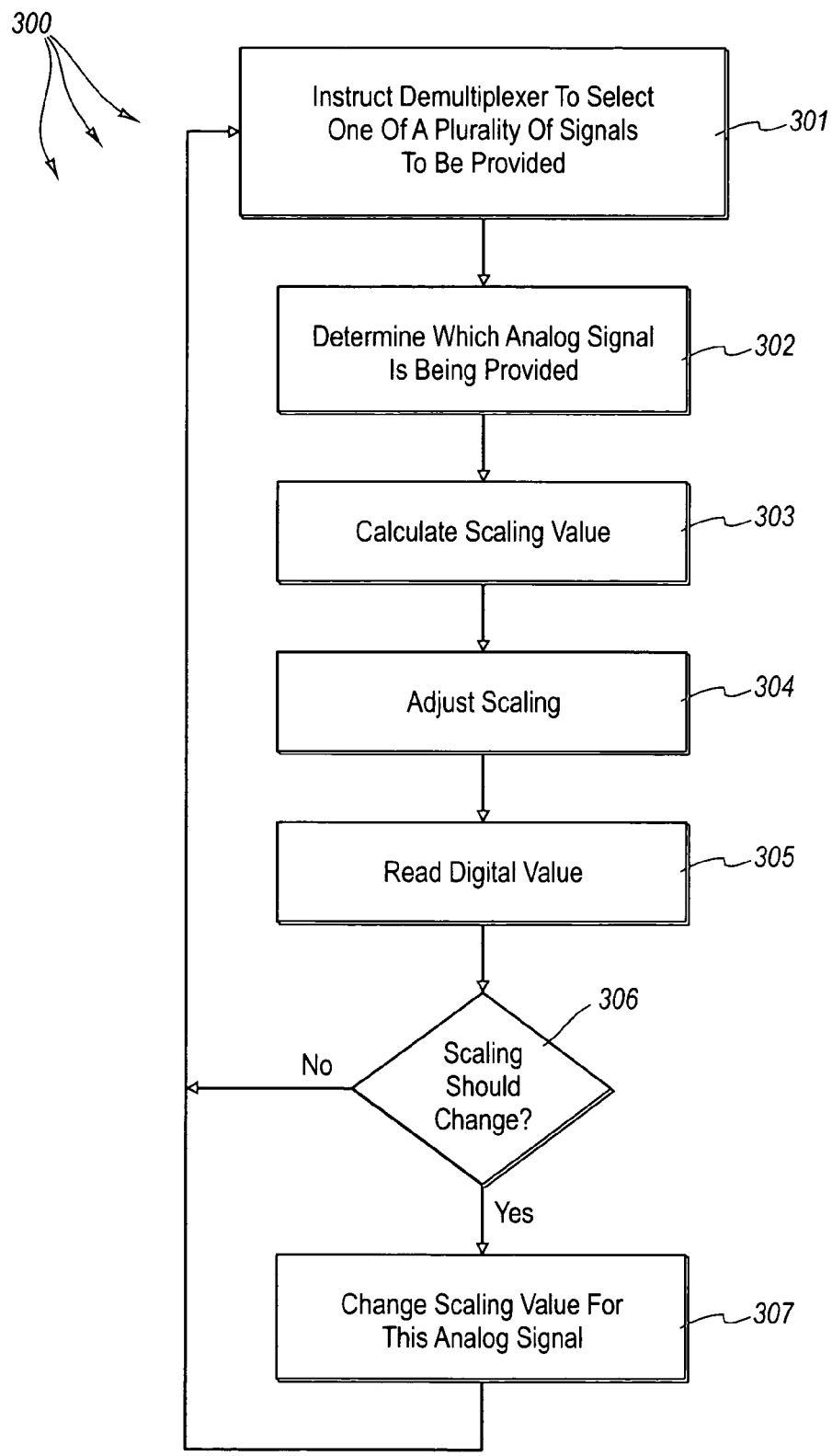
FIG. 3 illustrates a flowchart of a method for dynamically adjusting the analog-to-digital conversion and processing the results of the conversion in accordance with the principles of the present invention.

FIG. 3 illustrates a flowchart of a method 300 for dynamically adjusting the analog-to-digital conversion in accordance with the principles of the present invention. The method is performed by the system 100 in response to the one or more processors 106 executing the microcode 108.

First, the digital portion 109 of the system optionally instructs the multiplexer 210 to select one of the plurality of analog signals to be provided to the amplifier (act 301) as represented by arrow 112. Since the analog signal source 102 need not incorporate a multiplexer, this act is optional. Even if the multiplexer is present in the analog signal source 102, there is not a requirement that the multiplexing be controlled by the digital portion 109.

The system 100 then optionally determines which analog signal is currently being scaled (act 302). This determination may be made based on the current time, or based on which signal the digital portion 109 instructed the multiplexer 210 to provide. Once again, since there is no requirement for a multiplexer 210, or that multiple analog signals be provided from different sources, this act is optional as well.

The digital portion 109 then calculates a scaling value based upon which analog signal is being provided to the amplifier (act 303). This scaling value is preferably calculated such that the resulting scaled analog signal is suitable as an input analog signal to the analog-to-digital converter 104. The scaled value may be selected so that if the analog signal was previous out of the input range of the converter 104, it is brought back in range. Even if it was previously in range at the last check, the scaling value may be adjusted so that it is brought deeper into the range.

The digital portion 109 then adjusts the scaling (act 304) as represented by arrow 113 to allow the analog scaler 103 to scale the analog signal using the adjusted scaling value, The analog-to-digital converter 104 then converts the scaled analog signal into a digital signal representing a digital value.

The digital portion 109 then reads the digital value (act 305) as represented by the arrow 114, and then determines from the digital value whether the scaling value should be adjusted for the analog signal so that the scaled analog signal is within the input range, or further within the input range, of the analog-to-digital converter (decision block 306). If appropriate (Yes in decision block 306), then the scaling value may be changed for that analog signal (act 307).

Since the microcode 108 is what caused the adjustment in the scaling value, the adjustment in scaling is rapid. Accordingly, even highly fluctuating signals may be quickly rescaled as appropriate if they approach and exceed the input range boundaries of the analog-to-digital converter. The microcode logic also may properly interpret the digital value, regardless of how the gain (and optionally the current pre-scaling value) was adjusted, since the scaling and digital values are both known. Accordingly, the microcode may be designed to cause the analog signal voltage level to be optimized to the range of the analog-to-digital converter 104 regardless of how variable the voltage level of the pre-scaled signal is. The analog-to-digital converter 104 may be a low-bit (e.g., an 8-bit converter) while still providing accurate converted digital values.

Furthermore, since the pre-scaled analog signal may fluctuate widely while still providing accurate conversion, the analog signal may be multiplexed from a wide variety of different analog signal source (see e.g., FIG. 2). Accordingly, a single analog-to-digital converter may convert analog signals from a variety of sources thereby reducing the amount of area used by analog-to-digital converters.

While the principles of the present invention may be implemented in a virtually unlimited variety of architectures, FIG. 4 illustrates a laser transmitter/receiver 400 in which the principles of the present invention may be employed. While the laser transmitter/receiver 400 will be described in some detail, the laser transmitter/receiver 400 is described by way of illustration only, and not by way of restricting the scope of the invention. As the principles of the present invention allow for a single analog-to-digital converter to receive wide-ranging analog signals with reduced bit resolution requirements, space is preserved. This will become increasingly important for faster bit rates transfers that require space for other important speed-related functions. Accordingly, the principles of the present invention are suitable for 1G, 2G, 4G, 10G and higher bandwidth fiber channels. Furthermore, the principles of the present invention may be implemented in laser transmitter/receivers of any form factor such as XFP, SFP and SFF, without restriction. Having said this, the principles of the present invention are not limited to a laser transceiver environment at all.

The laser transmitter/receiver 400 receives an optical signal from fiber 410A using receiver 401. The receiver 401 transforms the optical signal to an electrical signal and provides that electrical signal to a post-amplifier 402. The post-amplifier 402 amplifies the signal and provides the amplified signal to the host as represented by arrow 402A.

The laser transmitter/receiver 400 may also receive electrical signals from the host for transmission onto the fiber 410B. Specifically, the laser driver 403 receives the electrical signal as represented by the arrow 403A, and drives the transmitter 404 (i.e., the laser) with signals that cause the transmitter 404 to emit onto the fiber 410B optical signals representative of the information in the electrical signal provided by the host.

The behavior of the receiver 401, the post-amplifier 402, the laser driver 403, and the transmitter 404 may vary dynamically due to a number of factors. For example, temperature changes, power fluctuations, and feedback conditions may each affect the performance of these components. Accordingly, the laser transmitter/receiver 400 includes a control chip 405, which evaluates temperature and voltage conditions, and receives information from the post-amplifier 402 (as represented by arrow 405A) and from the laser driver 403 (as represented by arrow 405B), which will allow the control chip 405 to counteract the dynamically varying performance, and detect when there is a loss of signal.

Specifically, the control chip 405 may counteract these changes by adjusting settings on the post-amplifier 402 and/or laser driver 403 as represented by the arrows 405A and 405B. The control chip 405 has access to a non-volatile memory 406, which in one embodiment, is an Electrically Erasable and Programmable Read Only Memory (EEPROM). Data and clock signals may be provided from the host to the control chip 405 using the serial clock line SCL, and the serial data line SDA. Also data may be provided from the control chip 405 to the host using serial data signal SDA to allow for digital diagnostics and readings of temperature levels, transmit/receiver power levels, and the like.

The control chip 405 includes both an analog portion 408 and digital portion. Together, they allow the control chip to implement logic digitally, while still largely interfacing with the rest of the laser transmitter/receiver 400 using analog signals. For example, the analog portion 408 may contain digital to analog converters, and analog to digital converters, high speed comparators (e.g., for event detection), voltage based reset generators, voltage regulators, voltage references, clock generator, and other analog components. This control chip 408 may contain all of the analog components described above with respect to FIG. 1

Figure 5:
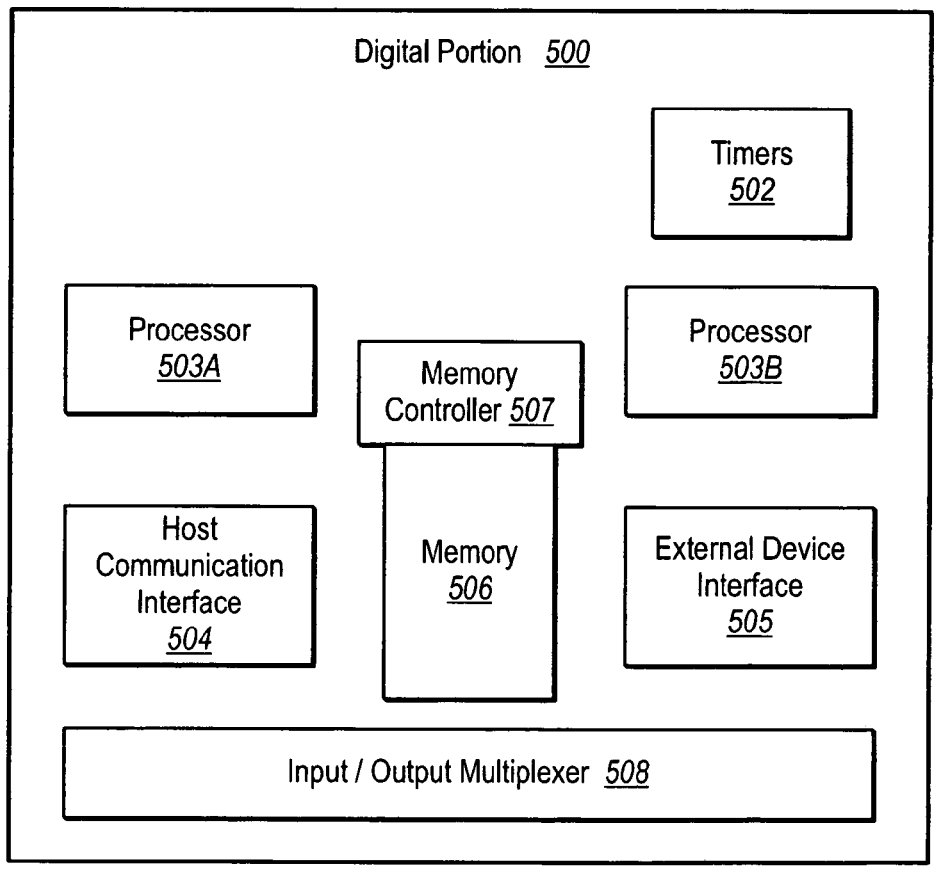
FIG. 5 illustrates a schematic of a digital portion of the laser transmitter/receiver of FIG. 4.

FIG. 5 illustrates the digital portion 500 of control chip 405 in further detail. For instance, a timer module 502 provides various timing signals used by the digital portion. Such timing signals may include, for example, programmable processor times. The timer module 502 may also act as a watchdog timer.

Two general-purpose processors 503A and 503B are also included, and are each configured to generate the watchdog signal when encountering a watchdog instruction. In this sense, the processors 503 may behave as the one or more processors 106 described above with respect to FIG. 1. The processors recognize instructions that follow a particular instruction set, and may perform normal general-purpose operation such as shifting, branching, adding, subtracting, multiplying, dividing, Boolean operations, comparison operations, and the like. In one embodiment, the general-purpose processors 503A and 503B are each a 16-bit processor and may be identically structured.

A host communications interface 504 is used to communicate with the host using the serial clock line SCL and the serial data line SDA of the laser transmitter/receiver 400. The external device interface 505 is used to communicate with, for example, other modules within the laser transmitter/receiver 400 such as, for example, the post-amplifier 402, the laser driver 403, or the memory 406.

The memory 506 may be Random Access Memory (RAM). The memory control 507 shares access to the memory 506 amongst each of the processors 503A and 503B and with the host communication interface 504 and the external device interface 505. This memory 506 may contain microcode. Accordingly, the memory 506 may behave as the memory 107 described above with respect to FIG. 1.

An input/output multiplexer 508 multiplexes the various input/output pins of the control chip 405 to the various components within the control chip 405. This enables different components to dynamically assign pins in accordance with the then-existing operational circumstances of the chip. Accordingly, there may be more input\output nodes within the control chip 405 than there are pins available on the control chip 405, thereby reducing the footprint of the control chip 405.

Having described a specific environment with respect to FIGS. 4 and 5 in which the principles of the present invention described with respect to FIGS. 1 through 3 may be employed, it will be understood that this specific environment is only one of countless architectures in which the principles of the present invention may be employed. As previously stated, the principles of the present invention are not intended to be limited to any particular environment.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed is:

1. A system comprising the following:
    a multiplexer that can receive a plurality of analog signals;
    an analog scaler configured to scale an analog signal that is received from the multiplexer;
    an analog-to-digital converter configured to convert the scaled analog signal to a digital signal;
    one or more processors; and
    a memory module having stored therein microcode that is accessible and executable by the one or more processors;
    wherein the microcode, when executed by the one or more processors, causes the system to perform the following:
        an act of determining which analog signal from the plurality of analog signals is being provided to the analog scaler by the multiplexer;
        an act of adjusting a scaling value of the analog scaler to allow the analog scaler to scale the analog signal using the adjusted scaling value, and to allow the analog-to-digital converter to convert the scaled signal into the digital signal representing a digital value;
        an act of reading the digital value; and
        an act of determining from the digital value whether the scaling value should be adjusted for the analog signal so that the scaled analog signal is within the input range, or further within the input range, of the analog-to-digital converter.

2. A system in accordance with claim 1, wherein when it is determined that scaling value should be adjusted, the microcode is further configured to perform the following:
    an act of repeating the acts of adjusting and reading with the adjusted scaling value.

3. A system in accordance with claim 1, further comprising the following:
    a plurality of analog signal sources that generate the plurality of analog signals; and
    wherein the microcode, when executed by the one or more processors, causes the system to perform the following:
        an act of calculating the scaling value based upon which analog signal is being provided to the analog scaler.

4. A system in accordance with claim 3, wherein the microcode, when executed by the one or more processors, causes the system to perform the following:
an act of instructing the multiplexer to select one of the plurality of analog signals to be provided to the analog scaler.

5. A system in accordance with claim 4, further comprising the following:
a plurality of sensors generating at least some of the plurality of analog signals.

6. A system in accordance with claim 5, wherein the plurality of sensors comprises the following:
a temperature sensor.

7. A system in accordance with claim 6, wherein the plurality of sensors comprises the following:
a voltage supply level sensor.

8. A system in accordance with claim 7, wherein the plurality of sensors comprises the following:
a receive strength sensor.

9. A system in accordance with claim 8, wherein the plurality of sensors comprises the following:
a transmit strength sensor.

10. A system in accordance with claim 7, wherein the plurality of sensors comprises the following:
a transmit strength sensor.

11. A system in accordance with claim 5, wherein the plurality of sensors comprises the following:
a voltage supply level sensor.

12. A system in accordance with claim 5, wherein the plurality of sensors comprises the following:
a receive strength sensor.

13. A system in accordance with claim 5, wherein the plurality of sensors comprises the following:
a transmit strength sensor.

14. A system in accordance with claim 1, wherein the system is implemented in a laser transmitter/receiver.

15. A system in accordance with claim 14, wherein the laser transmitter/receiver is a 1 G laser transceiver.

16. A system in accordance with claim 14, wherein the laser transmitter/receiver is a 2 G laser transceiver.

17. A system in accordance with claim 14, wherein the laser transmitter/receiver is a 4 G laser transceiver.

18. A system in accordance with claim 14, wherein the laser transmitter/receiver is a 10 G laser transceiver.

19. A system in accordance with claim 14, wherein the laser transmitter/receiver is a laser transceiver suitable for fiber channels greater than 10 G.

20. A system in accordance with claim 14, wherein the laser transmitter/receiver is an XFP laser transceiver.

21. A system in accordance with claim 14, wherein the laser transmitter/receiver is an SFP laser transceiver.

22. A system in accordance with claim 14, wherein the laser transmitter/receiver is a SFF laser transceiver.

23. In a system that includes an analog scaler configured to scale an analog signal, an analog-to-digital converter configured to convert the scaled analog signal to a digital signal, one or more processors, and a memory module having stored therein microcode that is accessible and executable by the one or more processors, a method for dynamically adjusting the analog-to-digital conversion, the method performed by the one or more processors in response to execution of the microcode, the method comprising the following:
an act of receiving a plurality of analog signals;
an act of determining which analog signal from the plurality of analog signals to provide to an analog scaler;
an act of adjusting a scaling value of the analog scaler to allow the analog scaler to scale the analog signal using the scaling value, and to allow the analog-to-digital converter to convert the scaled analog signal into a digital signal representing a digital value;
an act of reading the digital value; and
an act of determining from the digital value whether the scaling value should be adjusted for the analog signal so that the scaled analog signal is within the input range, or further within the input range, of the analog-to-digital converter.

24. A method in accordance with claim 23, wherein when it is determined that scaling value should be adjusted, the microcode is further configured to perform the following:
an act of repeating the acts of adjusting and reading with the adjusted scaling value.

25. The method in accordance with claim 23, wherein the system further includes a plurality of analog signal sources that generates the plurality of analog signals, and a multiplexer that receives the plurality of analog signals, and provides the resulting multiplexed signal and least indirectly to the amplifier, the method further comprising the following:
an act of calculating the scaling value based upon which analog signal is being provided to the analog scaler.

26. The method in accordance with claim 25, further comprising the following:
an act of instructing the multiplexer to select one of the plurality of analog signals to be provided to the analog scaler.

27. A method in accordance with claim 25, wherein the plurality of analog signal sources comprises a temperature sensor.

28. A method in accordance with claim 25, wherein the plurality of analog signal sources comprises a voltage supply level sensor.

29. A method in accordance with claim 25, wherein the plurality of analog signal sources comprises a receive strength sensor.

30. A method in accordance with claim 25, wherein the plurality of analog signal sources comprises a transmit strength sensor.

31. One or more computer-readable media for using in a system that includes an analog scaler configured to scale an analog signal, an analog-to-digital converter configured to convert the scaled analog signal to a digital signal, and one or more processors, the one or more computer-readable media having thereon microcode that when executed by the one or more processors, is configured to cause the system to perform the following:
an act of receiving a plurality of analog signals from a plurality of analog sources;
an act of determining which analog signal from the plurality of analog signals is provided to an analog scaler;
an act of adjusting a scaling value of the analog scaler to allow the analog scaler to scale the signal using the scaling value, and to allow the analog-to-digital converter to convert the scaled analog signal into a digital signal representing a digital value;
an act of reading the digital value; and
an act of determining from the digital value whether the scaling value should be adjusted for the analog signal so that the scaled analog signal is within the input range, or further within the input range, of the analog-to-digital converter.

32. The one or more computer-readable media in accordance with claim 31, wherein the microcode further causes the system to perform the following when executed by the one or more processors:

when it is determined that scaling value should be adjusted, an act of repeating the acts of adjusting and reading with the adjusted scaling value.

33. The one or more computer-readable media in accordance with claim 31, wherein the microcode further causes the system to perform the following when executed by the one or more processors:

an act of calculating the scaling value based upon which analog signal is being provided to the amplifier.

34. The one or more computer-readable media in accordance with claim 33, wherein the microcode further causes the system to perform the following when executed by the one or more processors:

an act of instructing the multiplexer to select one of the plurality of analog signals to be provided to the analog scaler.

35. The one or more computer-readable media in accordance with claim 33, wherein the plurality of analog signal sources comprises a temperature sensor.

36. The one or more computer-readable media in accordance with claim 33, wherein the plurality of analog signal sources comprises a voltage supply level sensor.

37. The one or more computer-readable media in accordance with claim 33, wherein the plurality of analog signal sources comprises a receive strength sensor.

38. The one or more computer-readable media in accordance with claim 33, wherein the plurality of analog signal sources comprises a transmit strength sensor.

39. A transceiver comprising:

a receiver that receives a first optical signal over an optical fiber and generates a first electrical signal that represents the first optical signal;

a post-amplifier that amplifies the first electrical signal;

a laser driver that receives a second electrical signal, wherein the laser driver drives a transmitter that produces a second optical signal that represents the second electrical signal; and a control chip that connects with the first electrical signal and with the second electrical signal and that determines which of the first electrical signal and the second electrical signal to scale, the control chip comprising:

an analog portion that scales the first electrical signal or the second electrical signal based on which of the first electrical signal and the second electrical signal is selected, wherein the analog portion converts the scaled first electrical signal to a first digital value or the scaled second electrical signal to a second digital value; and a digital portion, wherein the digital portion uses microcode along with either the first digital value or the second digital value to adjust a scaling value that is used by the analog portion to scale either the first voltage or the second voltage to within an input range of the analog portion.

* * * * *